United States Patent
Wang et al.

(10) Patent No.: US 8,189,539 B2
(45) Date of Patent: May 29, 2012

(54) SYSTEM AND METHOD FOR FREQUENCY DIVERSITY

(75) Inventors: Michael Mao Wang, San Diego, CA (US); Fuyun Ling, San Diego, CA (US); Murali Ramaswamy Chari, San Diego, CA (US); Rajiv Vijayan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 340 days.

(21) Appl. No.: 11/192,789

(22) Filed: Jul. 29, 2005

(65) Prior Publication Data

US 2006/0109781 A1 May 25, 2006

Related U.S. Application Data

(60) Provisional application No. 60/592,999, filed on Jul. 29, 2004.

(51) Int. Cl.
*H04B 7/216* (2006.01)

(52) U.S. Cl. ............................... 370/335; 370/343

(58) Field of Classification Search .................. 370/335, 370/343; 455/23, 42
See application file for complete search history.

(56) References Cited

U.S. PATENT DOCUMENTS

| | | | |
|---|---|---|---|
| 5,177,766 A | 1/1993 | Holland et al. | |
| 5,315,592 A | 5/1994 | Conant et al. | |
| 5,943,330 A | 8/1999 | Hottinen | |
| 6,145,111 A | 11/2000 | Crozier et al. | |
| 6,154,484 A | 11/2000 | Lee et al. | |
| 6,208,663 B1 | 3/2001 | Schramm et al. | |
| 6,243,379 B1 | 6/2001 | Veerina et al. | |
| 6,298,463 B1 | 10/2001 | Bingeman | |
| 6,304,581 B1 | 10/2001 | Chen | 370/479 |
| 6,311,306 B1 | 10/2001 | White et al. | |
| 6,392,572 B1 | 5/2002 | Shiu et al. | |
| 6,421,333 B1 | 7/2002 | Jalali | |
| 6,580,497 B1 | 6/2003 | Asaka et al. | |
| 6,597,726 B2 | 7/2003 | Ozluturk | |
| 6,611,551 B1 | 8/2003 | Jones, IV et al. | |
| 6,667,962 B1 | 12/2003 | Lee et al. | |
| 6,697,990 B2 | 2/2004 | El-Gamal et al. | |
| 6,738,370 B2 | 5/2004 | Ostman | |
| 6,747,948 B1 | 6/2004 | Sarraf | 370/210 |
| 6,754,170 B1 | 6/2004 | Ward | |
| 6,956,842 B1 | 10/2005 | Okumura et al. | |
| 6,961,388 B2 | 11/2005 | Ling et al. | |
| 6,973,118 B1 | 12/2005 | Ikeda et al. | |
| 7,002,900 B2 | 2/2006 | Walton et al. | |

(Continued)

FOREIGN PATENT DOCUMENTS

AU 2007300037 4/2008

(Continued)

OTHER PUBLICATIONS

Eroz et al, "On the Design of Prunable Interleavers for Turbo Codes", 1999, pp. 1669-1673.

(Continued)

*Primary Examiner* — Temica M Beamer
(74) *Attorney, Agent, or Firm* — Gerald P. Joyce, III

(57) ABSTRACT

A system and method for frequency diversity uses interleaving. Subcarriers of an interlace are interleaved in a bit reversal fashion and the interlaces are interleaved in the bit reversal fashion.

28 Claims, 8 Drawing Sheets

U.S. PATENT DOCUMENTS

| | | | |
|---|---|---|---|
| 7,031,251 B2 * | 4/2006 | Chen et al. | 370/208 |
| 7,039,000 B2 | 5/2006 | You et al. | |
| 7,093,185 B2 | 8/2006 | Kim et al. | |
| 7,120,696 B1 | 10/2006 | Au et al. | |
| 7,145,940 B2 | 12/2006 | Gore et al. | |
| 7,154,936 B2 | 12/2006 | Bjerke et al. | |
| 7,170,849 B1 * | 1/2007 | Arivoli et al. | 370/208 |
| 7,248,652 B2 | 7/2007 | Sayeed | |
| 7,251,282 B2 | 7/2007 | Maltsev et al. | |
| 7,251,768 B2 | 7/2007 | Giannakis et al. | |
| 7,289,459 B2 | 10/2007 | Hayashi et al. | |
| 7,298,787 B2 | 11/2007 | Priotti | |
| 7,324,590 B2 | 1/2008 | Abrishamkar et al. | |
| 7,411,898 B2 | 8/2008 | Ehrlich et al. | |
| 7,457,350 B2 | 11/2008 | Baker et al. | |
| 2001/0034868 A1 | 10/2001 | El-Gamal et al. | |
| 2002/0131481 A1 | 9/2002 | Ozluturk | |
| 2002/0150181 A1 | 10/2002 | Sayeed | |
| 2002/0167924 A1 | 11/2002 | Agrawal et al. | |
| 2004/0028004 A1 * | 2/2004 | Hayashi et al. | 370/320 |
| 2004/0199846 A1 | 10/2004 | Matsumoto et al. | |
| 2004/0203885 A1 | 10/2004 | Quaid | |
| 2004/0218570 A1 | 11/2004 | Black et al. | |
| 2004/0240538 A1 | 12/2004 | Abrishamkar et al. | |
| 2005/0016201 A1 | 1/2005 | Ivanov et al. | |
| 2005/0111524 A1 | 5/2005 | Baker et al. | |
| 2005/0122928 A1 | 6/2005 | Vijayan et al. | |
| 2005/0135308 A1 | 6/2005 | Vijayan et al. | |
| 2005/0135517 A1 | 6/2005 | Coffey et al. | |
| 2005/0195763 A1 | 9/2005 | Kadous et al. | |
| 2005/0286611 A1 | 12/2005 | Priotti | |
| 2006/0034163 A1 | 2/2006 | Gore et al. | |
| 2006/0117167 A1 | 6/2006 | Evrard et al. | |
| 2006/0123310 A1 | 6/2006 | Wang et al. | |
| 2006/0133388 A1 | 6/2006 | Wang et al. | |
| 2006/0209927 A1 | 9/2006 | Khandekar et al. | |
| 2006/0215538 A1 | 9/2006 | Murthy et al. | |
| 2006/0280228 A1 | 12/2006 | Daniele et al. | |
| 2007/0025738 A1 | 2/2007 | Moore | |
| 2007/0036065 A1 | 2/2007 | Wang | |
| 2007/0082696 A1 | 4/2007 | Wang | |
| 2007/0232251 A1 | 10/2007 | Murthy et al. | |

FOREIGN PATENT DOCUMENTS

| | | |
|---|---|---|
| CN | 1345493 A | 4/2002 |
| EP | 1222828 A1 | 4/2001 |
| JP | 09-261209 | 10/1997 |
| JP | 2000-013356 | 1/2000 |
| JP | 2000-031838 | 1/2000 |
| JP | 2000-068975 | 3/2000 |
| JP | 2001-217861 | 8/2001 |
| JP | 2001-268048 | 9/2001 |
| JP | 2001-320345 | 11/2001 |
| JP | 2001-339657 | 12/2001 |
| JP | 2002057640 A | 2/2002 |
| JP | 2002-111621 | 4/2002 |
| JP | 2003-124904 | 4/2003 |
| JP | 2003-518816 | 6/2003 |
| JP | 2003-188848 | 7/2003 |
| JP | 2003-309535 | 10/2003 |
| JP | 2005-536097 | 11/2005 |
| JP | 2006-504366 | 2/2006 |
| KR | 20010088148 | 9/2001 |
| KR | 2004-61482 | 7/2004 |
| NZ | 211474 | 2/1989 |
| NZ | 503592 | 2/2002 |
| RU | 2134017 | 7/1999 |
| RU | 2137310 | 9/1999 |
| RU | 2178953 C2 | 1/2002 |
| RU | 2003109329 A | 1/2005 |
| SU | 1327296 | 7/1987 |
| TW | I228893 | 3/2005 |
| TW | I237511 | 8/2005 |
| TW | I244349 | 11/2005 |
| WO | 0035102 | 6/2000 |
| WO | WO0034799 | 6/2000 |
| WO | WO0036208 A1 | 6/2000 |
| WO | 0049780 | 8/2000 |
| WO | 0065726 | 11/2000 |
| WO | WO 01/47157 A2 | 6/2001 |
| WO | 02065647 | 8/2002 |
| WO | 02099994 | 12/2002 |
| WO | 2004015948 | 2/2004 |
| WO | WO2004/082200 A1 | 9/2004 |
| WO | WO 2005/022797 A2 | 3/2005 |
| WO | WO 2005/043829 | 5/2005 |
| WO | WO 2005/076641 A1 | 8/2005 |
| WO | WO 2006/016212 A1 | 2/2006 |
| WO | WO 2006/069319 | 6/2006 |
| WO | 2006086878 | 8/2006 |
| WO | 2006099222 | 9/2006 |
| WO | 2006099326 | 9/2006 |
| WO | WO 2008/039952 A1 | 4/2008 |

OTHER PUBLICATIONS

Cao et al, "Efficient Structure-Based Carrier Frequency Offset Estimation for Interleaved OFDMA Uplink".

Arshad K et al: "Performance of Wireless OFDM System Channel Estimation with Different Pilot Patterns" Spread Spectrum Techniques and Applications, 2004 IEEE Eighth International Symposium on Sydney, Australia Aug. 30-Sep. 2, 2004, Piscataway, NJ, USA, IEEE, Aug. 30, 2004, pp. 179-183, XP010754933.

Comsa C et al: "System level design of baseband OFDM for wireless LAN" Signals, Circuits and Systems, 2003. SCS 2003. International Symposium on Jul. 10-11, 2003, Piscataway, NJ, USA, IEEE, vol. 1, Jul. 10, 2003, pp. 313-316, XP010654936.

Muramatsu et al.:"Perfect reconstruction deinterlacer banks for field scalable video compression," International Conference on Image Processing, pp. 2279-2282, XP010786240 (2004).

Parthasarathy et al.: "Reliable transmission of high-quality video over ATM networks," IEEE Transactions on Image Processing, vol. 8, No. 3, XP011026288 (Mar. 1999).

Tia: "Forward Link Only Air Interface Specification" Rev. 1.1, Physical Layer, FLO Forum Technical Contribution to TR47, Dec. 22, 2005, pp. 5-8 to 5-24.

International Search Report—PCT/US05/027106, International Search Authority—European Patent Office—Nov. 14, 2005.

Written Opinion—PCT/US2005/027106, International Search Authority—European Patent Office—Nov. 14, 2005.

International Preliminary Report on Patentability—PCT/US2005/027106, International Search Authority—IPEA/US—Jul. 3, 2008.

Patterson & Hennessey, "Computer Organization and Design" 1994, Morgan Kaufmann Publishers, Figure 5.11 and description thereof and discussion, pp. 280-285.

Hill "A First Course on Coding Theory", 1986 Oxford University Press, Chapter 2, pp. 11-13.

Chari, et al, "FLO Physical Layer: An Overview," IEEE Transactions on Broadcasting, vol. 53, No. 1, Mar. 1, 2007, pp. 145-160, XP011172013, Piscataway, NJ, abstract, figs. 8,11,13 , Secs. IV.C.4, IV.C.8, IV.C.9.

"Forward Link Only Air Interface Specification for Terrestrial Mobile Multimedia Multicast: TIA-1099" EIA/TIA Standards, Telecomm. Industry Assoc., Aug. 1, 2006, XP017005609, Arlington, VA, Secs. 5.2.1.2..9.2.7, 5.2.1.2.9.2.8, 5.2.1.2.10.

Nevdyaev, L.M., Telecommunication Technologies, Moscow, Communication and Business, 2002, p. 347.

Cao, et al, "Efficient Structure-based Carrier Frequency Offset Estimation for Interleaved OFDMA Uplink" IEEE Transactions on Broadcasting, vol. 5, Jun. 11, 2003, pp. 3361-3365, Hoboken, NJ.

International Preliminary Examination Report PCT/US07/077031, WIPO Geneva Switzerland, Mar. 3, 2009.

International Preliminary Report on Patentability—PCT/US07/079785—European Patent Office—Berlin—Apr. 9, 2009.

International Preliminary Report on Patentability—PCT/US07/079785—The International Bureau of WIPO—Geneva, Switzerland—Mar. 31, 2009.

International Preliminary Report on Patentability—PCT/US07/079787—European Patent Office—Berlin—Apr. 9, 2009.

International Preliminary Report on Patentability-PCT/US2005/027104, International Bureau of WIPO-Geneva, Switzerland-Jan. 30, 2007.
International Search Report—PCT/US05/027104, International Search Authority—European Patent Office—Mar. 7, 2006.
International Search Report—PCT/US05/027105, International Search Authority—European Patent Office—Nov. 29, 2005.
International Search Report—PCT/US07/077031, International Search Authority—European Patent Office—May 19, 2008.
International Search Report—PCT/US07/079785, International Search Authority—European Patent Office—Mar. 6, 2008.
International Search Report—PCT/US07/079787, International Search Authority—European Patent Office—Feb. 27, 2008.
International Search Report, PCT/US2008/071168, International Searching Authority, European Patent Office, Jun. 17, 2009.
Written Opinion—PCT/US07/079785, International Search Authority—European Patent Office—Mar. 6, 2008.
Written Opinion—PCT/US07/079787, International Search Authority—European Patent Office—Feb. 27, 2008.
Written Opinion—PCT/US2007/077031, International Search Authority, European Patent Office, May 19, 2008.
Written Opinion, PCT/US2008/071168, International Searching Authority, European Patent Office, Jun. 17, 2009.
Written Opinion-PCT/US2005/027104, International Searching Authority-European Patent Office—Mar. 7, 2006.
Written Opinion-PCT/US2005/027105, International Searching Authority-European Patent Office-Nov. 29, 2005.
TIA: "Forward Link Only Air Interface Specifaction Rev. 1.1", Internet Citation, pp. 114-130, Jan. 10, 2006 http://ftp.tiaonline.org/TR-47/TR47/Working/20060110-Arlington-meeting1/TR471-20060110-004a-FLO%20AIS.pdf.
Taiwan Intellectual Property Office (TIPO), "Taiwan Search Report", App. No. TW096136065—Jan. 31, 2011, (040645U3B2TW).

* cited by examiner

- 502 → SLOT INDEX
- 504 → OFDM SYMBOL INDEX
- 506 → RESERVED FOR SCHEDULER
- 508 → RESERVED FOR PILOT

SYSTEM AND METHOD FOR FREQUENCY DIVERSITY

CLAIM OF PRIORITY UNDER 35 U.S.C. §119

The present application for patent claims priority to Provisional Application No. 60/592,999 entitled "METHOD OF CHANNEL INTERLEAVING IN AN OFDM WIRELESS COMMUNICATIONS SYSTEM" filed Jul. 29, 2004, and assigned to the assignee hereof and hereby expressly incorporated by reference herein.

REFERENCE TO CO-PENDING APPLICATIONS FOR PATENT

The present application for patent is related to the following co-pending U.S. patent applications:

"SYSTEM AND METHOD FOR MODULATION DIVERSITY" having Ser. No. 11/192,788, filed concurrently herewith, assigned to the assignee hereof, and expressly incorporated by reference herein; and "SYSTEM AND METHOD FOR TIME DIVERSITY" having Ser. No. 11/193,053, now issued as U.S. Pat. No. 7,583,584, filed concurrently herewith, assigned to the assignee hereof, and expressly incorporated by reference herein.

BACKGROUND

1. Field

The present disclosed embodiments relate generally to wireless communications, and more specifically to channel interleaving in a wireless communications system.

2. Background

Orthogonal frequency division multiplexing (OFDM) is a technique for broadcasting high rate digital signals. In OFDM systems, a single high rate data stream is divided into several parallel low rate substreams, with each substream being used to modulate a respective subcarrier frequency. It should be noted that although the present invention is described in terms of quadrature amplitude modulation, it is equally applicable to phase shift keyed modulation systems.

The modulation technique used in OFDM systems is referred to as quadrature amplitude modulation (QAM), in which both the phase and the amplitude of the carrier frequency are modulated. In QAM modulation, complex QAM symbols are generated from plural data bits, with each symbol including a real number term and an imaginary number term and with each symbol representing the plural data bits from which it was generated. A plurality of QAM bits are transmitted together in a pattern that can be graphically represented by a complex plane. Typically, the pattern is referred to as a "constellation". By using QAM modulation, an OFDM system can improve its efficiency.

It happens that when a signal is broadcast, it can propagate to a receiver by more than one path. For example, a signal from a single transmitter can propagate along a straight line to a receiver, and it can also be reflected off of physical objects to propagate along a different path to the receiver. Moreover, it happens that when a system uses a so-called "cellular" broadcasting technique to increase spectral efficiency, a signal intended for a received might be broadcast by more than one transmitter. Hence, the same signal will be transmitted to the receiver along more than one path. Such parallel propagation of signals, whether man-made (i.e., caused by broadcasting the same signal from more than one transmitter) or natural (i.e., caused by echoes) is referred to as "multipath".

It can be readily appreciated that while cellular digital broadcasting is spectrally efficient, provisions must be made to effectively address multipath considerations.

Fortunately, OFDM systems that use QAM are more effective in the presence of multipath conditions (which, as stated above, must arise when cellular broadcasting techniques are used) than are QAM techniques in which only a single carrier frequency is used. More particularly, in single carrier QAM systems, a complex equalizer must be used to equalize channels that have echoes as strong as the primary path, and such equalization is difficult to execute. In contrast, in OFDM systems the need for complex equalizers can be eliminated altogether simply by inserting a guard interval of appropriate length at the beginning of each symbol. Accordingly, OFDM systems that use QAM are preferred when multipath conditions are expected.

In a typical trellis coding scheme, the data stream is encoded with a convolutional encoder and then successive bits are combined in a bit group that will become a QAM symbol. Several bits are in a group, with the number of bits per group being defined by an integer "m" (hence, each group is referred to as having an "m-ary" dimension). Typically, the value of "m" is four, five, six, or seven, although it can be more or less.

After grouping the bits into multi-bit symbols, the symbols are interleaved. "Interleave" means that the symbol stream is rearranged in sequence, to thereby randomize potential errors caused by channel degradation. To illustrate, suppose five words are to be transmitted. If, during transmission of a non-interleaved signal, a temporary channel disturbance occurs an entire word can be lost before the channel disturbance abates, and it can be difficult if not impossible to know what information had been conveyed by the lost word.

In contrast, if the letters of the five words are sequentially rearranged (i.e., "interleaved") prior to transmission and a channel disturbance occurs, several letters might be lost, perhaps one letter per word. Upon decoding the rearranged letters, however, all five words would appear, albeit with several of the words missing letters. It will be readily appreciated that under these circumstances, it would be relatively easy for a digital decoder to recover the data substantially in its entirety. After interleaving the m-ary symbols, the symbols are mapped to complex symbols using QAM principles noted above, multiplexed into their respective sub-carrier channels, and transmitted.

BRIEF DESCRIPTION OF THE DRAWINGS

FIG. 4 shows a channelization diagram in accordance with an embodiment;

FIG. 5 shows a channelization diagram with all one's shifting sequence resulting in long runs of good and poor channel estimates for a particular slot, in accordance with an embodiment.

DETAILED DESCRIPTION

Figure 1:
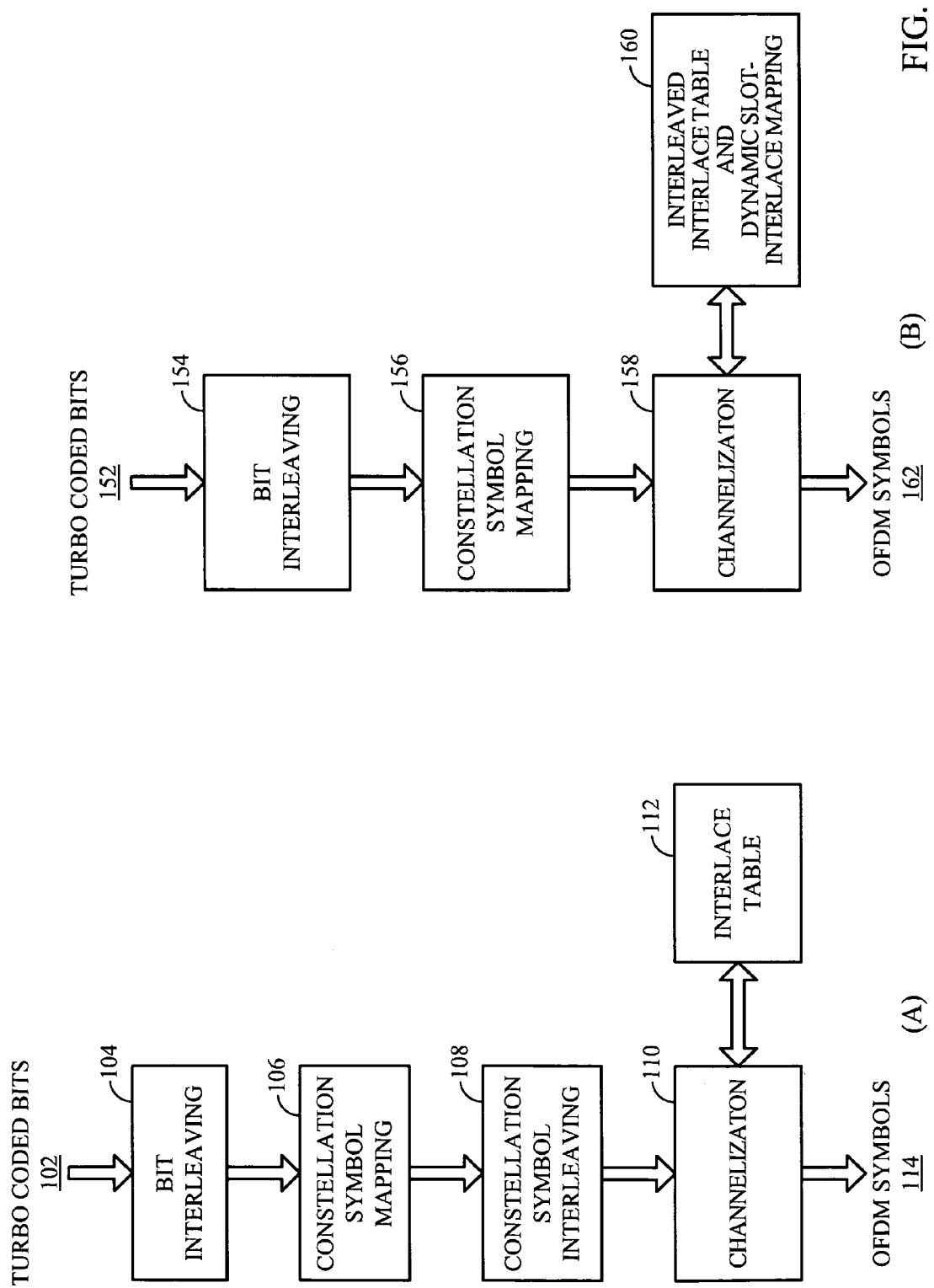
FIG. 1a shows a channel interleaver in accordance with an embodiment.
FIG. 1b shows a channel interleaver in accordance with another embodiment.

In an embodiment, a channel interleaver comprises a bit interleaver and a symbol interleaver. FIG. 1 shows two types of channel interleaving schemes. Both schemes use bit interleaving and interlacing to achieve maximum channel diversity.

FIG. 1a shows a channel interleaver in accordance with an embodiment. FIG. 1b shows a channel interleaver in accordance with another embodiment. The interleaver of FIG. 1b uses a bit-interleaver solely to achieve m-ary modulation diversity and uses a two-dimension interleaved interlace table and run-time slot-to-interlace mapping to achieve frequency diversity which provides better interleaving performance without the need for explicit symbol interleaving.

FIG. 1a shows Turbo coded bits 102 input into bit interleaving block 104. Bit interleaving block 104 outputs interleaved bits, which are input into constellation symbol mapping block 106. Constellation symbol mapping block 106 outputs constellation symbol mapped bits, which are input into constellation symbol interleaving block 108. Constellation symbol interleaving block 108 outputs constellation symbol interleaved bits into channelization block 110. Channelization block 110 interlaces the constellation symbol interleaved bits using an interlace table 112 and outputs OFDM symbols 114.

FIG. 1b shows Turbo coded bits 152 input into bit interleaving block 154. Bit interleaving block 154 outputs interleaved bits, which are input into constellation symbol mapping block 156. Constellation symbol mapping block 15 outputs constellation symbol mapped bits, which are input into channelization block 158. Channelization block 158 channelizes the constellation symbol interleaved bits using an interleaved interlace table and dynamic slot-interlace mapping 160 and outputs OFDM symbols 162.

Bit Interleaving for Modulation Diversity

Figure 2A:
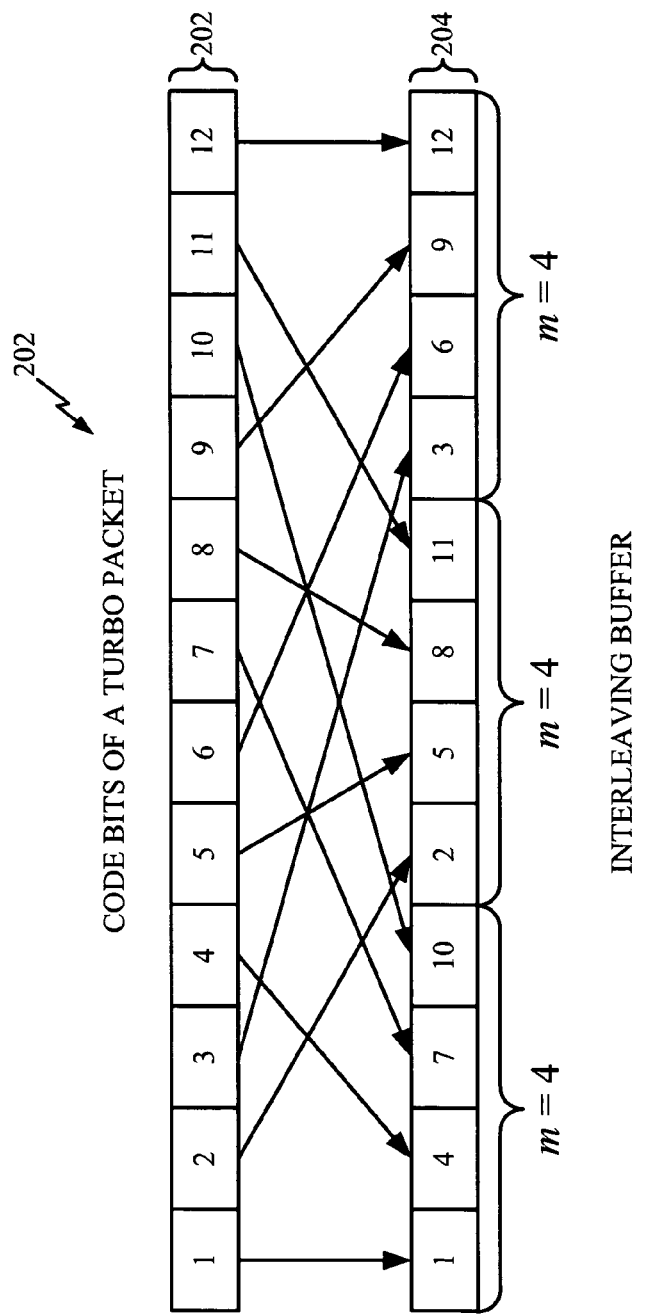
FIG. 2a shows code bits of a turbo packet placed into an interleaving buffer in accordance with an embodiment.
Figure 2B:
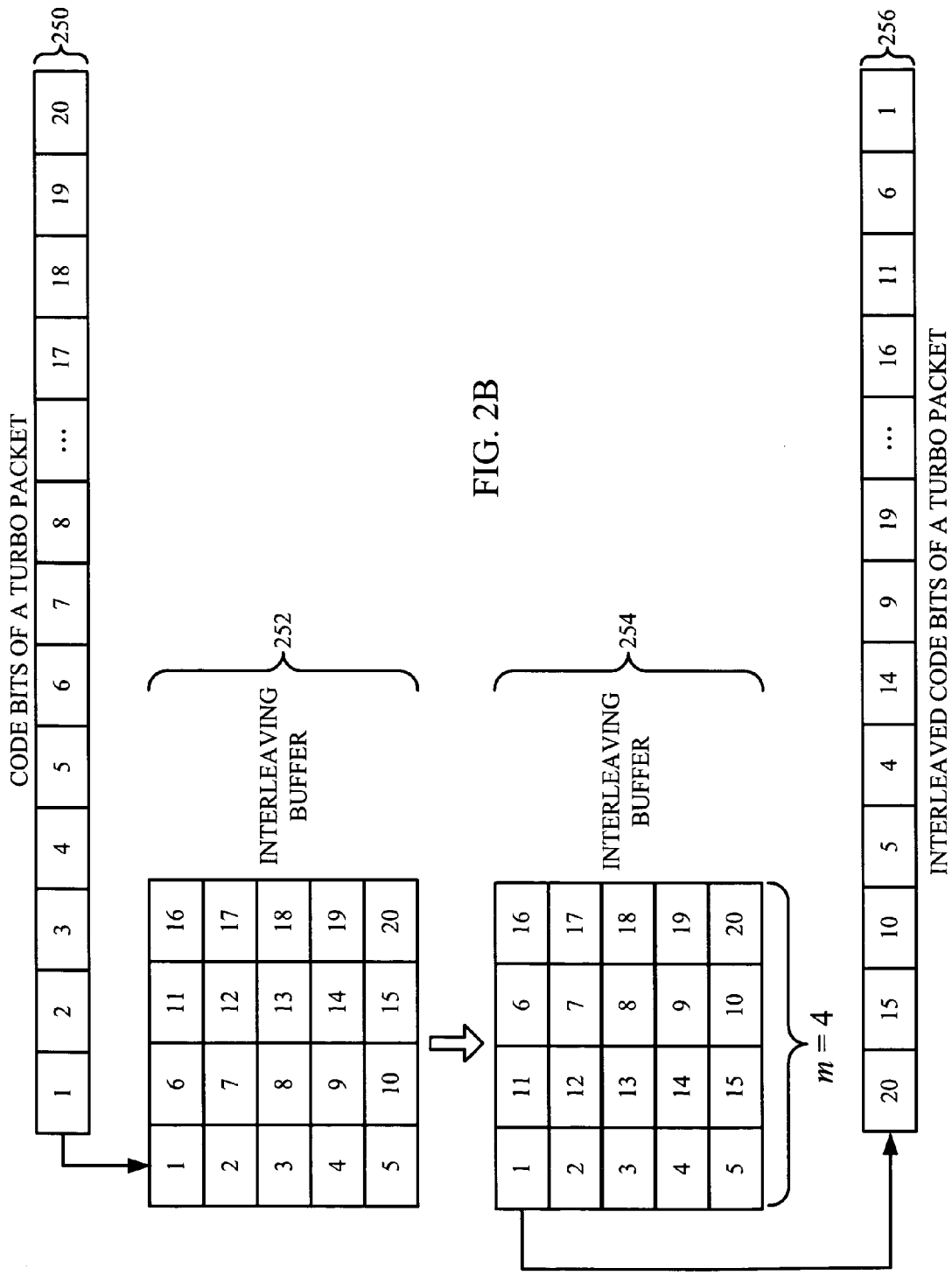
FIG. 2b shows an interleaver buffer arranged into an N/m rows by m columns matrix in accordance with an embodiment.

The interleaver of FIG. 1b uses bit interleaving 154 to achieve modulation diversity. The code bits 152 of a turbo packet are interleaved in such a pattern that adjacent code bits are mapped into different constellation symbols. For example, for 2m-ary modulation, the N bit interleaver buffer is divided into N/m blocks. Adjacent code bits are written into adjacent blocks sequentially and then are read out one by one from the beginning of the buffer to the end in the sequential order, as shown in FIG. 2a (Top). This guarantees that adjacent code bits are mapped to different constellation symbols. Equivalently, as is illustrated in FIG. 2b (Bottom), the interleaver buffer is arranged into an N/m rows by m columns matrix. Code bits are written into the buffer column by column and are read out row by row. To avoid the adjacent code bit being mapped to the same bit position of the constellation symbol due to the fact that certain bits of a constellation symbol are more reliable than the others for 16QAM depending on the mapping (for example, the first and third bits are more reliable than the second and fourth bits), rows shall be read out from left to right and right to left alternatively.

FIG. 2a shows code bits of a turbo packet 202 placed into an interleaving buffer 204 in accordance with an embodiment. FIG. 2b is an illustration of a bit interleaving operation in accordance with an embodiment. Code bits of a Turbo packet 250 are placed into an interleaving buffer 252 as shown in FIG. 2b. The interleaving buffer 252 is transformed by swapping the second and third columns, thereby creating interleaving buffer 254, wherein m=4, in accordance with an embodiment. Interleaved code bits of a Turbo packet 256 are read from the interleaving buffer 254.

For simplicity, a fixed m=4 may be used, if the highest modulation level is 16 and if code bit length is always divisible by 4. In this case, to improve the separation for quadrature phase shift keying (QPSK), the middle two columns are swapped before being read out. This procedure is depicted in FIG. 2b (Bottom). It would be apparent to those skilled in the art that any two columns may be swapped. It would also be apparent to those skilled in the art that the columns may be placed in any order. It would also be apparent to those skilled in the art that the rows may be placed in any order.

In another embodiment, as a first step, the code bits of a turbo packet 202 are distributed into groups. Note that the embodiments of both FIG. 2a and FIG. 2b also distribute the code bits into groups. However, rather than simply swapping rows or columns, the code bits within each group are shuffled according to a group bit order for each given group. Thus, the order of four groups of 16 code bits after being distributed into groups may be {1, 5, 9, 13} {2, 6, 10, 14} {3, 7, 11, 15} {4, 8, 12, 16} using a simple linear ordering of the groups and the order of the four groups of 16 code bits after shuffling may be {13, 9, 5, 1} {2, 10, 6, 14} {11, 7, 15, 3} {12, 8, 4, 16}. Note that swapping rows or columns would be a regressive case of this intra-group shuffling.

Interleaved Interlace for Frequency Diversity

In accordance with an embodiment, the channel interleaver uses interleaved interlace for constellation symbol interleaving to achieve frequency diversity. This eliminates the need for explicit constellation symbol interleaving. The interleaving is performed at two levels:

Within or Intra Interlace Interleaving: In an embodiment, 500 subcarriers of an interlace are interleaved in a bit-reversal fashion.

Between or Inter Interlace Interleaving: In an embodiment, eight interlaces are interleaved in a bit-reversal fashion.

It would be apparent to those skilled in the art that the number of subcarriers can be other than 500. It would also be apparent to those skilled in the art that the number of interlaces can be other than eight.

Note that since 500 is not power of 2, a reduced-set bit reversal operation shall be used in accordance with an embodiment. The following code shows the operation:

```
vector<int> reducedSetBitRev(int n)
{
    int m=exponent(n);
    vector<int> y(n);
    for (int i=0, j=0; i<n; i++,j++)
    {
        int k;
        for (; (k=bitRev(j,m))>=n; j++);
        y[i]=k;
    }
    return y;
}
``` where n=500, m is the smallest integer such that $2^m > n$ which is 9, and bitRev is the regular bit reversal operation.

Figure 3:
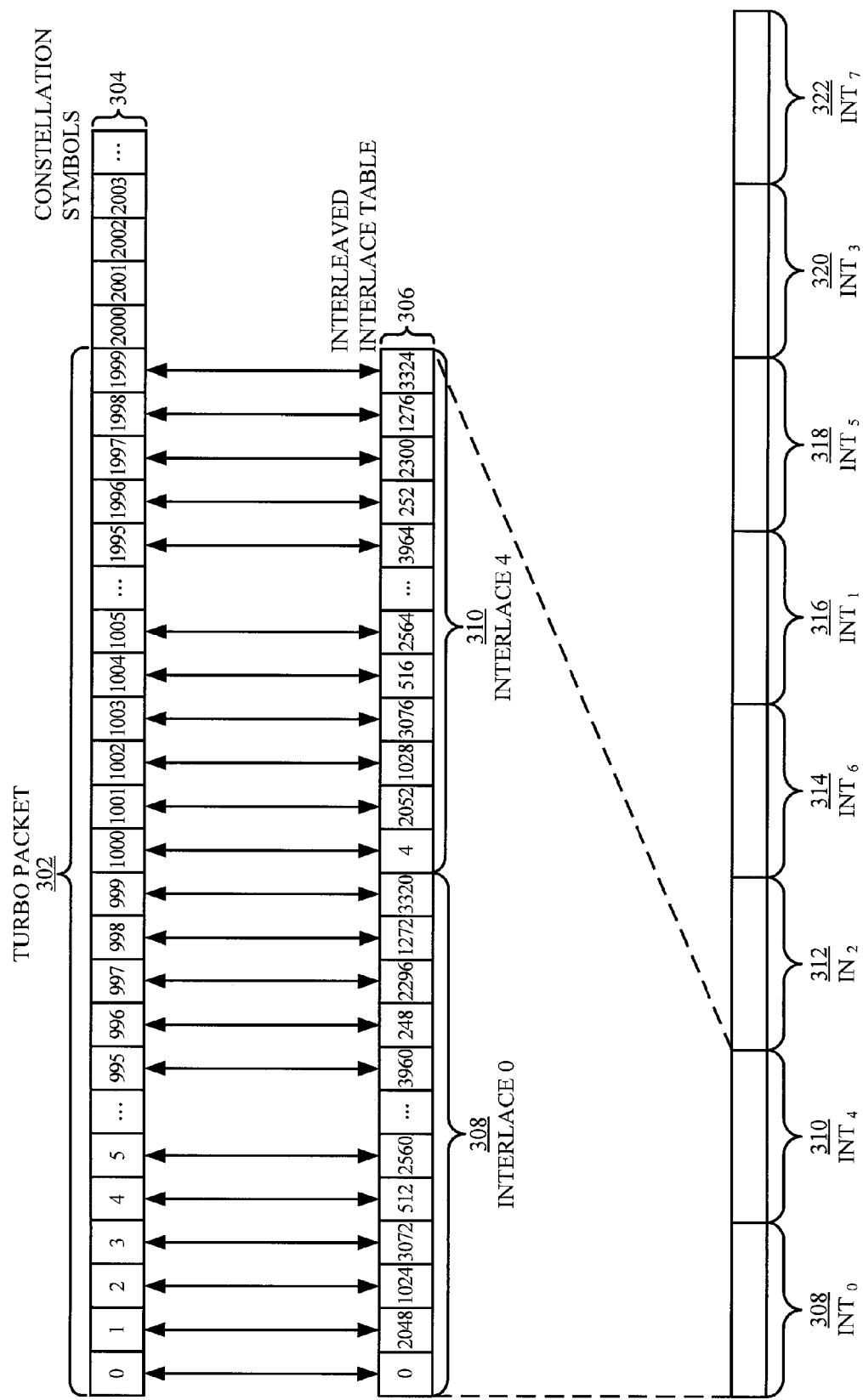
FIG. 3 illustrates an interleaved interlace table in accordance with an embodiment.

The symbols of the constellation symbol sequence of a data channel are mapped into the corresponding subcarriers in a sequential linear fashion according to the assigned slot index, determined by a Channelizer, using the interlace table as is depicted in FIG. 3, in accordance with an embodiment.

FIG. 3 illustrates an interleaved interlace table in accordance with an embodiment. Turbo packet 302, constellation symbols 304, and interleaved interlace table 306 are shown. Also shown are interlace 0 (308), interlace 4 (310), interlace 2 (312), interlace 6 (314), interlace 1 (316), interlace 5 (318), interlace 3 (320), and interlace 7 (322).

In an embodiment, one out of the eight interlaces is used for pilot, i.e., Interlace 2, and Interlace 6 are used alternatively for pilot. As a result, the Channelizer can use seven interlaces for scheduling. For convenience, the Channelizer uses Slot as a scheduling unit. A slot is defined as one interlace of an OFDM symbol. An Interlace Table is used to map a slot to a particular interlace. Since eight interlaces are used, there are then eight slots. Seven slots will be set aside for use for Channelization and one slot for Pilot. Without loss of generality, Slot 0 is used for the Pilot and Slots 1 to 7 are used for Channelization, as is shown in FIG. 4 where the vertical axis is the slot index 402, the horizontal axis is the OFDM symbol index 404 and the bold-faced entry is the interlace index assigned to the corresponding slot at an OFDM symbol time.

Figure 4:
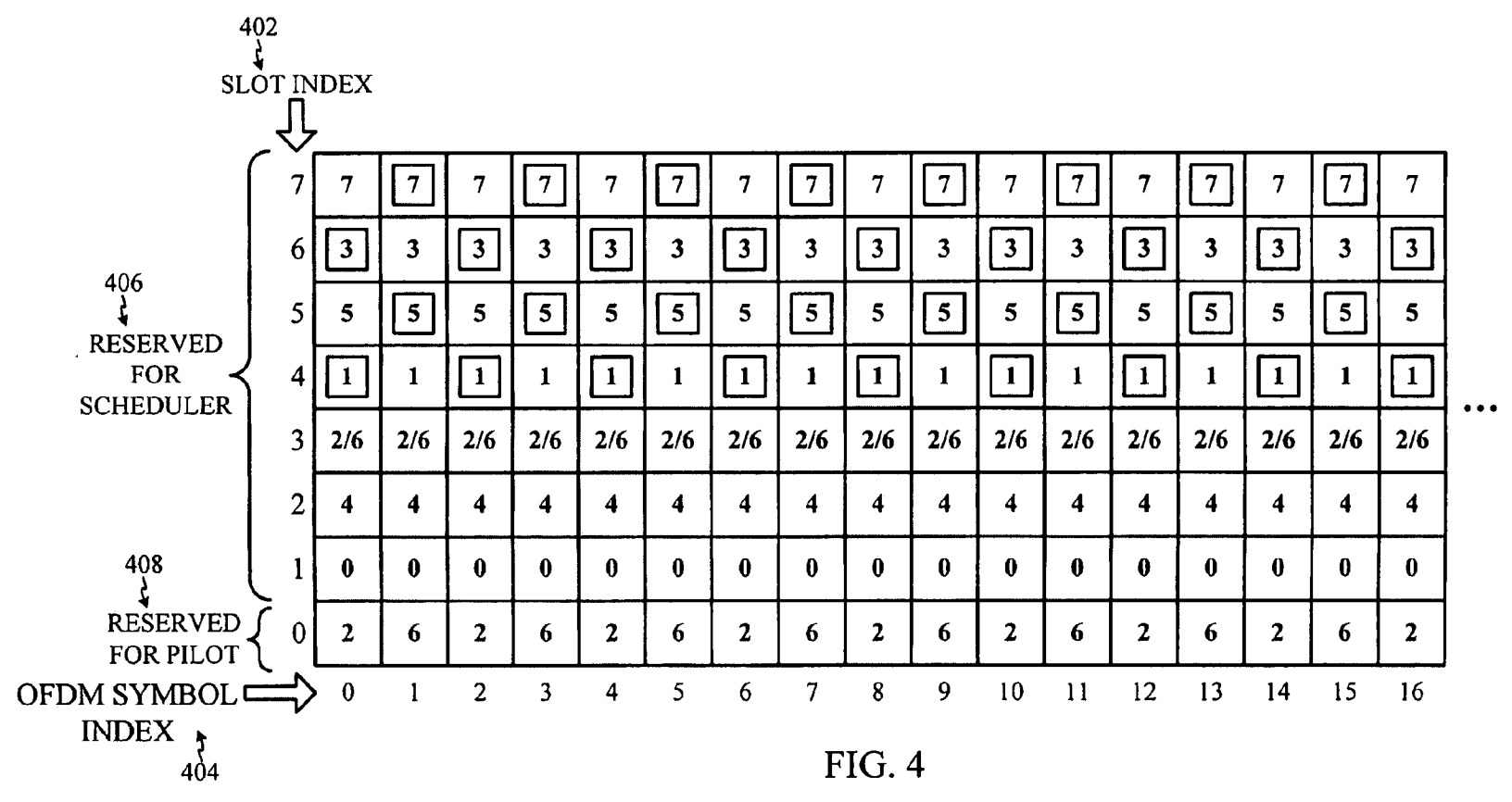

FIG. 4 shows a channelization diagram in accordance with an embodiment. FIG. 4 shows the slot indices reserved for the scheduler 406 and the slot index reserved for the Pilot 408. The bold faced entries are interlace index numbers.

The number surrounded with a square is the interlace adjacent to the pilot and consequently with good channel estimate. Since the Scheduler always assigns a chunk of contiguous slots and OFDM symbols to a data channel, it is clear that due to the inter-interlace interleaving, the contiguous slots that are assigned to a data channel will be mapped to discontinuous interlaces. More frequency diversity gain can then be achieved.

However, this static assignment (i.e., the slot to physical interlace mapping table[1] does not change over time) does suffer one problem. That is, if a data channel assignment block (assuming rectangular) occupies multiple OFDM symbols, the interlaces assigned to the data channel do not change over time, resulting in loss of frequency diversity. The remedy is simply cyclically shifting the Scheduler interlace table (i.e., excluding the Pilot interlace) from OFDM symbol to OFDM symbol.

[1] The Scheduler slot table does not include the Pilot slot.

FIG. 5 depicts the operation of shifting the Scheduler interlace table once per OFDM symbol. This scheme successfully destroys the static interlace assignment problem, i.e., a particular slot is mapped to different interlaces at different OFDM symbol time.

FIG. 5 shows a channelization diagram with an all one's shifting sequence resulting in long runs of good and poor channel estimates for a particular slot 502, in accordance with an embodiment. FIG. 5 shows the slot indices reserved for the scheduler 506 and the slot index reserved for the Pilot 508. OFDM symbol index 504 is shown on the horizontal axis.

Figure 6:
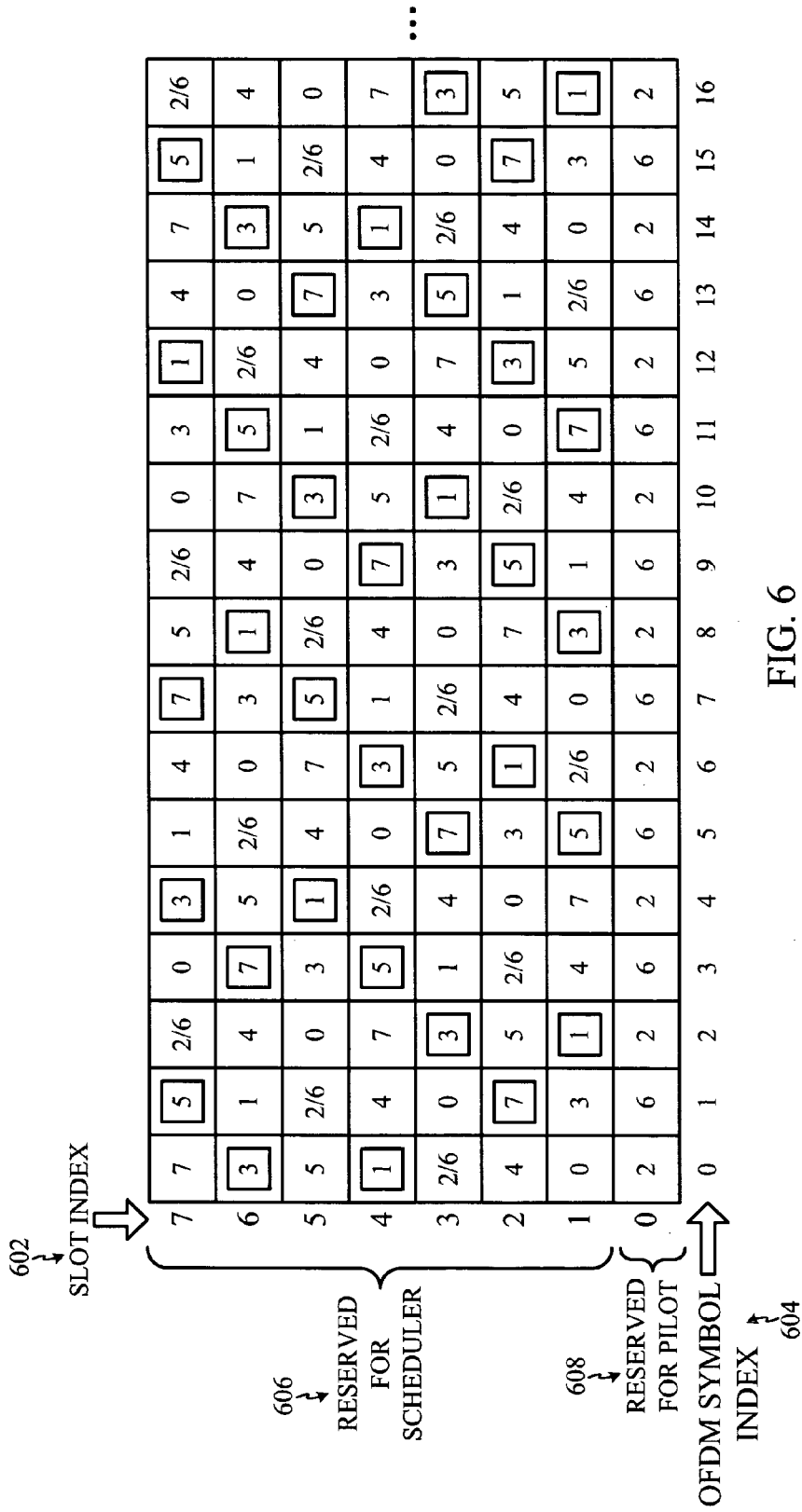
FIG. 6 shows a Channelization diagram with all two's shifting sequence resulting in evenly spread good and poor channel estimate interlaces.

However, it is noticed that slots are assigned four continuous interlaces with good channel estimates followed by long runs of interlaces with poor channel estimates in contrast to the preferred patterns of short runs of good channel estimate interlaces and short runs of interlaces with poor channel estimates. In the figure, the interlace that is adjacent to the pilot interlace is marked with a square. A solution to the long runs of good and poor channel estimates problem is to use a shifting sequence other than the all one's sequence. There are many sequences can be used to fulfill this task. The simplest sequence is the all two's sequence, i.e., the Scheduler interlace table is shifted twice instead of once per OFDM symbol. The result is shown in FIG. 6 which significantly improves the Channelizer interlace pattern. Note that this pattern repeats every 2×7=14 OFDM symbols, where 2 is the Pilot interlace staggering period and 7 is the Channelizer interlace shifting period.

To simplify the operation at both transmitters and receivers, a simple formula can be used to determine the mapping from slot to interlace at a given OFDM symbol time:

$$i = R'\{(N-((R \times t) \% N) + s - 1) \% N\}$$

where
- $N = I - 1$ is the number of interlaces used for traffic data scheduling, where I is the total number of interlaces;
- $i \in \{0, 1, \ldots, I-1\}$, excluding the pilot interlace, is the interlace index that Slot s at OFDM symbol t maps to;
- $t = 0, 1, \ldots, T-1$ is the OFDM symbol index in a super frame, where T is the total number of OFDM symbols in a frame[2];
- $s = 1, 2, \ldots, S-1$ where s is the slot index and S is the total number of slots;
- R is the number of shifts per OFDM symbol;
- R' is the reduced-set bit-reversal operator. That is, the interlace used by the Pilot shall be excluded from the bit-reversal operation.

[2] OFDM symbol index in a superframe instead of in a frame gives additional diversity to frames since the number of OFDM symbols in a frame in the current design is not divisible by 14.

Example: In an embodiment, I=8, R=2. The corresponding Slot-Interlace mapping formula becomes $$i = R'\{(7-((2 \times t) \% 7) + s - 1) \% 7\}$$

where R' corresponds to the following table:

| x $\Rightarrow \Re'\{x\}$ |
| --- |
| 0 $\Rightarrow$ 0 |
| 1 $\Rightarrow$ 4 |
| 2 $\Rightarrow$ 2 or 6 |
| 3 $\Rightarrow$ 1 |
| 4 $\Rightarrow$ 5 |
| 5 $\Rightarrow$ 3 |
| 6 $\Rightarrow$ 7 |

This table can be generated by the following code:
int reducedSetBitRev(int x, int exclude, int n)

```
{
    int m=exponent(n);
    int y;
    for (int i=0; j=0; i<=x; i++, j++)
    {
        for (; (y=bitRev(j, m))==exclude; j++);
    }
    return y;
}
``` where m=3 and bitRev is the regular bit reversal operation.

For OFDM symbol t=11, Pilot uses Interlace 6. The mapping between Slot and Interlace becomes:

Slot 1 maps to interlace of R'{(7−(2×11)% 7+1−1)% 7}=R{6}=7;

Slot 2 maps to interlace of R'{(7−(2×11)% 7+2−1)% 7}=R{0}=0;

Slot 3 maps to interlace of R'{(7−(2×11)% 7+3−1)% 7}=R{1}=4;

Slot 4 maps to interlace of R'{(7−(2×11)% 7+4−1)% 7}=R{2}=2;

Slot 5 maps to interlace of R'{(7−(2×11)% 7+5−1)% 7}=R{3}=1;

Slot 6 maps to interlace of R'{(7−(2×11))% 7+6−1)% 7}=R{4}=5;

Slot 7 maps to interlace of R'{(7−(2−11))% 7+7−1)% 7}=R{5}=3;

The resulting mapping agrees with the mapping in FIG. 6. FIG. 6 shows a Channelization diagram with all two's shifting sequence resulting in evenly spread good and poor channel estimate interlaces.

In accordance with an embodiment, an interleaver has the following features:

The bit interleaver is designed to taking advantage of m-Ary modulation diversity by interleaving the code bits into different modulation symbols;

The "symbol interleaving" is designed to achieve frequency diversity by INTRA-interlace interleaving and INTER-interlace interleaving;

Additional frequency diversity gain and channel estimation gain are achieved by changing the slot-interlace mapping table from OFDM symbol to OFDM symbol. A simple rotation sequence is proposed to achieve this goal.

Figure 7:
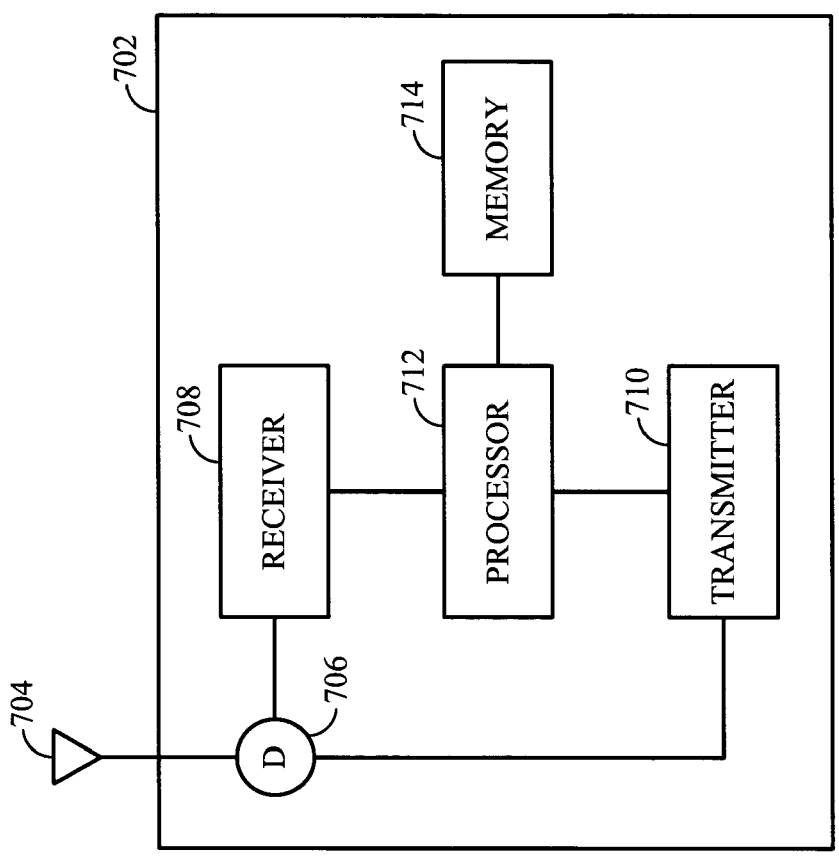
FIG. 7 shows a wireless device configured to implement interleaving in accordance with an embodiment.

FIG. 7 shows a wireless device configured to implement interleaving in accordance with an embodiment. Wireless device 702 comprises an antenna 704, duplexer 706, a receiver 708, a transmitter 710, processor 712, and memory 714. Processor 712 is capable of performing interleaving in accordance with an embodiment. The processor 712 uses memory 714 for buffers or data structures to perform its operations.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for improving frequency diversity in an OFDM system using interleaved interlaces for constellation symbol interleaving, comprising:
    interleaving code bits by dividing the code bits into groups, shuffling the code bits within each group according to a specific bit order, and reading out the code bits across the groups;
    generating constellation mapped symbol bits using the interleaved code bits;
    mapping the constellation mapped symbol bits into subcarriers of an interlace;
    interleaving the subcarriers of an interlace in a bit reversal fashion; and
    interleaving the interlaces in the bit reversal fashion.

2. The method of claim 1, wherein the bit reversal fashion is a reduced-set bit reversal operation if the number of subcarriers is not a power of two.

3. The method of claim 2, wherein the number of subcarriers is 500.

4. The method of claim 3, wherein the number of interlaces is eight.

5. The method of claim 1, wherein interleaving subcarriers of an interlace in a bit reversal fashion involves mapping symbols of a constellation symbol sequence into corresponding subcarriers in a sequential linear fashion according to an assigned slot index using an interlace table.

6. A processor configured to:
    interleave code bits by dividing them into groups, shuffling the code bits within each group according to a specific bit order, and reading out the code bits across the groups;
    generate constellation mapped symbol bits using the interleaved code bits;
    map the constellation mapped symbol bits into subcarriers of an interlace;
    interleave the sub carriers of an interlace in a bit reversal fashion; and
    interleave the interlaces in the bit reversal fashion.

7. A processor comprising:
   means for interleaving code bits by dividing them into groups, shuffling the code bits within each group according to a specific bit order, and reading out the code bits across the groups;
   means for generating constellation mapped symbol bits using the interleaved code bits;
   means for mapping the constellation mapped symbol bits into subcarriers of an interlace;
   means for interleaving subcarriers of an interlace in a bit reversal fashion; and
   means for interleaving the interlaces in the bit reversal fashion.

8. A computer readable medium containing computer executable instructions to perform an interleaving method, the interleaving method comprising:
   interleaving code bits by dividing them into groups, shuffling the code bits within each group according to a specific bit order, and reading out the code bits across the groups;
   generating constellation mapped symbol bits using the interleaved code bits;
   mapping the constellation mapped symbol bits into subcarriers of an interlace;
   interleaving the subcarriers of an interlace in a bit reversal fashion; and
   interleaving the interlaces in the bit reversal fashion.

9. The computer readable medium of claim 8, wherein the bit reversal fashion is a reduced-set bit reversal operation if the number of subcarriers is not a power of two.

10. The computer readable medium of claim 9, wherein the number of subcarriers is 500.

11. The computer readable medium of claim 10, wherein the number of interlaces is eight.

12. The computer readable medium of claim 8, wherein interleaving the subcarriers of an interlace in a bit reversal fashion involves mapping symbols of a constellation symbol sequence into corresponding subcarriers in a sequential linear fashion according to an assigned slot index using an interlace table.

13. The computer readable medium of claim 12, wherein interleaving the subcarriers of an interlace in a bit reversal fashion further comprises shifting at least a portion of the interlace table at least one per OFDM symbol.

14. The computer readable medium of claim 12, wherein interleaving the subcarriers of an interlace in a bit reversal fashion further comprises shifting at least a portion of the interlace table at least twice per OFDM symbol.

15. The method of claim 5, wherein interleaving the subcarriers of an interlace in a bit reversal fashion further comprises shifting at least a portion of the interlace table at least one per OFDM symbol.

16. The method of claim 5, wherein interleaving the subcarriers of an interlace in a bit reversal fashion further comprises shifting at least a portion of the interlace table at least twice per OFDM symbol.

17. The processor of claim 6, wherein the bit reversal fashion is a reduced-set bit reversal operation if the number of subcarriers is not a power of two.

18. The processor of claim 17, wherein the number of subcarriers is 500.

19. The processor of claim 18, wherein the number of interlaces is eight.

20. The processor of claim 6, wherein interleaving the subcarriers of an interlace in a bit reversal fashion involves mapping symbols of a constellation symbol sequence into corresponding subcarriers in a sequential linear fashion according to an assigned slot index using an interlace table.

21. The processor of claim 20, wherein interleaving the subcarriers of an interlace in a bit reversal fashion further comprises shifting at least a portion of the interlace table at least one per OFDM symbol.

22. The processor of claim 20, wherein interleaving the subcarriers of an interlace in a bit reversal fashion further comprises shifting at least a portion of the interlace table at least twice per OFDM symbol.

23. The processor of claim 7, wherein the bit reversal fashion is a reduced-set bit reversal operation if the number of subcarriers is not a power of two.

24. The processor of claim 23, wherein the number of subcarriers is 500.

25. The processor of claim 24, wherein the number of interlaces is eight.

26. The processor of claim 7, wherein the means for interleaving subcarriers of an interlace in a bit reversal fashion further comprises means for mapping symbols of a constellation symbol sequence into corresponding subcarriers in a sequential linear fashion according to an assigned slot index using an interlace table.

27. The processor of claim 26, wherein the means for interleaving the subcarriers of an interlace in a bit reversal fashion further comprises means for shifting at least a portion of the interlace table at least one per OFDM symbol.

28. The processor of claim 26, wherein the means for interleaving the subcarriers of an interlace in a bit reversal fashion further comprises means for shifting at least a portion of the interlace table at least twice per OFDM symbol.

* * * * *